(12) United States Patent
Sonoda et al.

(10) Patent No.: US 6,291,886 B1
(45) Date of Patent: Sep. 18, 2001

(54) SEMICONDUCTOR DEVICE HAVING WIRINGS WITH REFLECTION PREVENTING FILM AND METHOD OF MANUFACTURING THE SAME

(75) Inventors: Masahisa Sonoda; Hiroaki Tsunoda, both of Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/245,300

(22) Filed: Feb. 5, 1999

(30) Foreign Application Priority Data

Feb. 18, 1998 (JP) ............................................... P10-036367

(51) Int. Cl.⁷ .......................... H01L 23/48; H01L 23/52; H01L 29/40
(52) U.S. Cl. ........................................... 257/751; 257/437
(58) Field of Search ................................... 257/770, 771, 257/765, 751, 753, 437, 632, 626

(56) References Cited

U.S. PATENT DOCUMENTS 5,776,831 * 7/1998 Padmanabhan et al. ............ 438/653
5,888,588 * 3/1999 Nagabushnam et al. ............ 438/592
6,100,579 * 8/2000 Sonoda et al. ....................... 257/632

FOREIGN PATENT DOCUMENTS

4117258 A * 12/1992 (DE) .

* cited by examiner

Primary Examiner—Sara Crane
Assistant Examiner—Thien F Tran
(74) Attorney, Agent, or Firm—Oblon, Spivak, McClelland, Maier & Neustadt, P.C.

(57) ABSTRACT

In a semiconductor device, a wiring layer (data line 31DL), which has a TiNx film 31C serving as a reflection preventing film at its uppermost layer, is covered with a protection film 32, and a nitrogen composition ratio x of the TiNx film 31C is adjusted more than 0.8 and less than 1.1. Most preferably, the nitrogen composition ratio x is set to more than 1.01 and less than 1.1. A nonvolatile memory device is installed in the semiconductor device. A plasma CVD silicon oxide film is employed as the protection film 32.

10 Claims, 11 Drawing Sheets

RELATED ART

RELATED ART

RELATED ART

SEMICONDUCTOR DEVICE HAVING WIRINGS WITH REFLECTION PREVENTING FILM AND METHOD OF MANUFACTURING THE SAME

BACKGROUND OF THE INVENTION

1. Field of the Invention

The present invention relates to a semiconductor device having wiring layers with a reflection preventing film and a method of manufacturing the same. More particularly, the present invention relates to a semiconductor device having a configuration in which wiring layers having a reflection preventing film at least at the uppermost layer are covered with a protection film and a method of manufacturing the same. Still more particularly, the present invention relates to a semiconductor device which has a configuration in which wiring layers each having a reflection preventing film are connected to a nonvolatile memory element and the wiring layers are covered with a protection film and a method of manufacturing the same.

2. Description of the Related Art

As the semiconductor memory device into which stored information can be written freely on the user side, there are known nonvolatile memory devices such as an erasable and programmable read-only memory (EPROM), an electrically erasable and programmable read-only memory (EEPROM), etc.

As shown in FIG. 16, a nonvolatile memory element M in a nonvolatile memory device is mainly composed of a semiconductor substrate 1 formed of a p-type single crystal silicon substrate. The nonvolatile memory element M is formed in a region surrounded by a device separating insulating film (field isolation film) 2 on a principal plane of the semiconductor substrate 1.

The nonvolatile memory element M comprises a channel forming region, a first gate insulating film 3, a floating gate electrode 4, a second gate insulating film 5, a control gate electrode 6, and a pair of n-type semiconductor regions 8 employed as a source region and a drain region. The channel forming region is formed on a surface of the semiconductor substrate 1. In order to improve a information retaining characteristic, at least the floating gate electrode 4 is covered with a silicon oxide film 7 of fine film quality.

The nonvolatile memory element M is positioned at an intersection portion of a word line 6WL and a data line 11DL and is electrically connected to the word line 6WL and the data line 11DL. The word line 6WL is formed integrally with the control gate electrode 6 of the nonvolatile memory element M. Thus, the word line 6WL is formed of the same conductive layer as the control gate electrode 6. The data line 11DL is formed on an interlayer insulating film 9 which covers the nonvolatile memory element M. The data line 11DL is connected to an n-type semiconductor region 8, which is employed as the drain region, via a connection hole (a contact hole) 10 which is formed in the interlayer insulating film 9.

A protection film (passivation film) 12 is formed on the data line 11DL to cover the data line 11DL and the nonvolatile memory element M. In the nonvolatile memory device, a plasma CVD silicon oxide film which is formed by the plasma CVD method to enable fine film quality and low temperature film formation is employed as the protection film 12. The protection film 12 can enhance a retaining characteristic of information stored in the nonvolatile memory element M.

A method of manufacturing the above nonvolatile memory device will be explained with reference to FIGS. 17 to 19. First, as shown in FIG. 17, the nonvolatile memory element M is formed on the principal plane of the semiconductor substrate 1. The interlayer insulating film 9 to cover the nonvolatile memory element M is then formed. As shown in FIG. 18, the connection hole 10 is then formed in the interlayer insulating film 9 on the n-type semiconductor region 8 which is employed as the drain region of the nonvolatile memory element M.

Then, as shown in FIG. 19, the data line 11DL which is connected electrically to the n-type semiconductor region 8 via the connection hole 10 is formed on the interlayer insulating film 9. The data line 11DL is formed as an at least double-layered structure which consists of an aluminum alloy film 11A and a titanium nitride (TiN) film 11B being deposited on a surface of the aluminum alloy film 11A. The aluminum alloy film 11A is deposited by the sputtering method to have a film thickness of 800 nm. The TiN film 11B is employed as a reflection preventing film which can prevent excessive exposure caused by a halation phenomenon, which is generated by the reflection of light on a surface of the aluminum alloy film 11A, when an etching mask employed to pattern the data line 11DL is formed by the photo-lithography. The TiN film 11B is similarly deposited by the sputtering method to have a film thickness of 30 nm. The aluminum alloy film 11A and the TiN film 11B, after deposited, are patterned by the etching using the reactive ion etching (RIE) method.

Then, as shown in FIG. 16, the protection film 12 covering the data line 11DL is formed. As the protection film 12, the plasma CVD silicon oxide film which is formed by reacting an $SiH_4$ gas, an $N_2O$ gas, and an $N_2$ gas in their plasma state at the substrate temperature of 400° C. is employed.

Then, in order to reduce wiring resistance by increasing aluminum crystal grains of the aluminum alloy film 11A of the data line 11DL, sintering is performed. This sintering is performed in the forming gas atmosphere at the heat treatment temperature of 400° C. to 450° C. for about five minutes. A mixed gas of $H_2$ and $N_2$ (a flow rate ratio is $H_2:N_2=1:9$) is employed as the forming gas.

When a series of above manufacturing steps have been completed, the nonvolatile memory device is implemented.

In the above-mentioned nonvolatile memory device, following problems are not taken in consideration. With the larger capacity and higher operation speed in information reading of the nonvolatile memory device, a pattern of the data line 11DL is miniaturized more and more. The TiN film 11B serving as the reflection preventing film, which is formed on a surface layer of the data line 11DL, is essential for such miniaturization. If a nitrogen composition ratio of the TiN film 11B is increased higher, reflectance of the surface of the TiN film 11B is decreased, so that performance as the reflection preventing film can be enhanced. Therefore, such a process is carried out normally that, when the TiN film 11B is sputtered, a large amount of $N_2$ gas is supplied to increase the nitrogen composition ratio of the TiN film 11B.

However, in case a reflection preventing function is enhanced by increasing the nitrogen composition ratio of the TiN film 11B, the $N_2$ gas is escaped or evaporated from the TiN film 11B by the sintering process which is performed after the protection film 12 has been formed. For this reason, there has been the problem such that there is a high possibility that peeling of the protection film 12 and disconnection of the data line 11DL are caused due to generation of the $N_2$ gas.

An enlarged sectional shape of a defective portion in the related art is shown in FIG. 20. As shown in FIG. 20, the $N_2$ gas generated from the TiN film 11B pushes up the protection film 12 and creates a cavity 13 on the boundary between the data line 11DL and the protection film 12. As a result, the protection film 12 peels off the data line 11DL. In addition, due to the strong pressure of the $N_2$ gas generated from the TiN film 11B, the data line 11DL is scraped out and then disconnected. An Ar gas as well as the $N_2$ gas is contained in the gas generated from the TiN film 11B. Ar which is employed to generate the plasma atmosphere in sputtering is taken into the TiN film 11B. Such Ar being taken into is then discharged as the Ar gas.

In particular, in the nonvolatile memory device, since the plasma CVD silicon oxide film which has fine film quality is employed as the protection film 12 for the purpose of improving the information retaining characteristic, discharge routes for both inert gases of the $N_2$ gas and the Ar gas are lost. Hence, the above peeling of the protection film 12 and the disconnection of the data line 11DL appear remarkably in the nonvolatile memory device. These facts have been found by the inventors of the present invention.

In addition, in order to prevent the peeling of the protection film 12 and the disconnection of the data line 11DL, the inventors of the present invention have tried to reduce the nitrogen composition ratio of the TiN film 11B by performing the heating process at about 400° C. after the data line 11DL has been patterned. As a result, the peeling of the protection film 12 and the disconnection of the data line 11DL can be suppressed, nevertheless such a problem has newly arisen that aluminum hillock is generated in the aluminum alloy film 11A of the data line 11DL because of addition of the heat treatment step. An enlarged sectional shape of another defective portion as an issue in the related art is shown in FIG. 21. As shown in FIG. 21, the aluminum hillock 11a is grown from the patterned sidewall of the aluminum alloy film 11A in the lateral direction. In the event that the degree of growth is large, neighboring data lines 11DL are short-circuited by the aluminum hillock 11a.

SUMMARY OF THE INVENTION

The present invention has been made to overcome the above problems, and it is an object of the present invention to provide a semiconductor device with high reliability, which is capable of preventing peeling of a protection film, disconnection of wiring layers, etc. due to an inert gas which is generated from a reflection preventing film.

Further, it is another object of the present invention to provide a nonvolatile memory device with high reliability, which is capable of improving its information retaining characteristics while preventing peeling of the protection film, disconnection of wiring layers, etc. due to the inert gas which is generated from the reflection preventing film.

Furthermore, it is another object of the present invention to provide a method of manufacturing a semiconductor device or a nonvolatile memory device, which is capable of achieving the above-mentioned object and improving yield of fabrication while preventing short-circuit between wiring layers due to generation of hillock.

In order to overcome the above problem, according to a first aspect of the present invention, there is provided a semiconductor device comprising:

a wiring layer having a TiNx film, which has a nitrogen composition ratio x of less than 1.1, as a reflecting preventing film at its uppermost layer; and a protection film formed on the wiring layer.

Preferably, the nitrogen composition ratio x of the TiNx film is set to more than 0.8 and less than 1.1. More preferably, the nitrogen composition ratio x of the TiNx film is set to more than 1.01 and less than 1.1. The protection film includes a plasma CVD film, and in more detail the protection film contains a plasma CVD silicon oxide film which is formed by a plasma CVD method using a gas having Si—H bonds as a material gas.

In the first aspect of the present invention, since the nitrogen composition ratio x of the TiNx film which is formed as the uppermost layer of the wiring layer can be set properly to thus reduce reflectance of the surface, such nitrogen composition ratio x of the TiNx film can be adjusted to less than 1.1 while keeping a reflection preventing function. Therefore, an amount of the $N_2$ gas being escaped or evaporated from the TiNx film can be reduced, and thus peeling of the TiNx film due to generation of the $N_2$ gas and disconnection of the wiring layer, etc. can be prevented. As a result, the semiconductor device with high reliability, which can prevent peeling of the TiNx film due to generation of the $N_2$ gas and disconnection of the wiring layer, etc. can be provided.

According to a second aspect of the present invention, there is provided a semiconductor device comprising:

a nonvolatile memory element;

a wiring layer formed on the nonvolatile memory element and having a TiNx film, which has a nitrogen composition ratio x of less than 1.1, as a reflecting preventing film at its uppermost layer; and a protection film formed on the wiring layer.

Preferably, the wiring layer consists of an aluminum alloy film and the TiNx film being formed on the aluminum alloy film. More preferably, the wiring layer consists of a barrier metal film, an aluminum alloy film formed on the barrier metal film, and the TiNx film formed on the aluminum alloy film. Preferably, the nitrogen composition ratio x of the TiNx film is set to more than 0.8 and less than 1.1. In more detail, the nitrogen composition ratio x of the TiNx film is set to more than 1.01 and less than 1.1. Preferably, the protection film includes a plasma CVD film. Preferably, the protection film contains a plasma CVD silicon oxide film which is formed by a plasma CVD method using a gas having Si—H bonds as a material gas.

In the second aspect of the present invention, since the nitrogen composition ratio x of the TiNx film which is formed as the uppermost layer of the wiring layer can be set properly to thus reduce reflectance of the surface, such nitrogen composition ratio x of the TiNx film can be adjusted to less than 1.1 while keeping the reflection preventing function. Hence, the amount of the $N_2$ gas being escaped or evaporated from the TiNx film can be reduced, and thus peeling of the TiNx film due to generation of the $N_2$ gas and disconnection of the wiring layer, etc. can be prevented.

In particular, if the plasma CVD film which has fine film quality and thus can reduce leakage of charges serving as information is employed as the protection film to enhance the information retaining characteristic of the nonvolatile memory element, discharge routes of the $N_2$ gas being escaped or evaporated from the TiNx film can be cut off by the protection film. When the discharge routes of the $N_2$ gas on the boundary between the TiNx film and the protection film are lost, the $N_2$ gas pushes up the protection film to then cause the peeling of the protection film. In addition, the wiring layer is disconnected because of abrupt generation of the pressure of the $N_2$ gas. These phenomena appear remarkably in case the protection film is formed by the plasma CVD film. Accordingly, while maintaining the intrinsic reflection preventing function, peeling of the TiNx film due to generation of the N$_2$ gas and disconnection of the wiring layer, etc. can be prevented by controlling the nitrogen composition ratio x optimally. Moreover, since the plasma CVD film which has fine film quality can be employed, the information retaining characteristic of the nonvolatile memory element can be improved.

According to a third aspect of the present invention, there is provided a method of manufacturing a semiconductor device, comprising the steps of:

(a) forming an aluminum film or an aluminum alloy film on a surface of a substrate, then forming a TiNx film on the aluminum film or the aluminum alloy film as a reflection preventing film, and then forming a wiring layer by patterning the TiNx film and the aluminum film or the aluminum alloy film in sequence respectively;

(b) forming a protection film covering the wiring layer;

(c) applying heat treatment to the aluminum film or the aluminum alloy film of the wiring layer; and (d) applying heat treatment to the TiNx film in forming the TiNx film to adjust a nitrogen composition ratio x of the TiNx film to less than 1.1.

In addition, according to the third aspect of the present invention, in the method of manufacturing the semiconductor device, the step (e) of applying heat treatment to the TiNx film in forming the TiNx film to adjust the nitrogen composition ratio x of the TiNx film to less than 1.1 may be employed in place of the above step (d).

Preferably, according to the third aspect of the present invention, the step of forming a nonvolatile memory element on a principal plane of a substrate is provided prior to the step (a). More preferably, the step of forming the protection film is the step of forming the a plasma CVD silicon oxide film, which is formed by a plasma CVD method using the gas having Si—H bonds in the material gas to cover the nonvolatile memory element and the wiring layer.

In the third aspect of the present invention, the step of adjusting the nitrogen composition ratio x of the TiNx film by virtue of heat treatment is carried out prior to patterning of the aluminum film or the aluminum alloy film. Therefore, the aluminum hillock which is grown from the sidewall of the patterned aluminum or aluminum alloy film in the lateral direction after the aluminum film or the aluminum alloy film has been patterned can be prevented and also short-circuit between neighboring wiring layers can be prevented. As a result, yield of the semiconductor device in manufacturing can be improved.

DESCRIPTION OF THE PREFERRED EMBODIMENTS

Embodiments of the present invention will be explained in detail with reference to the accompanying drawings hereinafter.

FIRST EMBODIMENT

Figure 1:
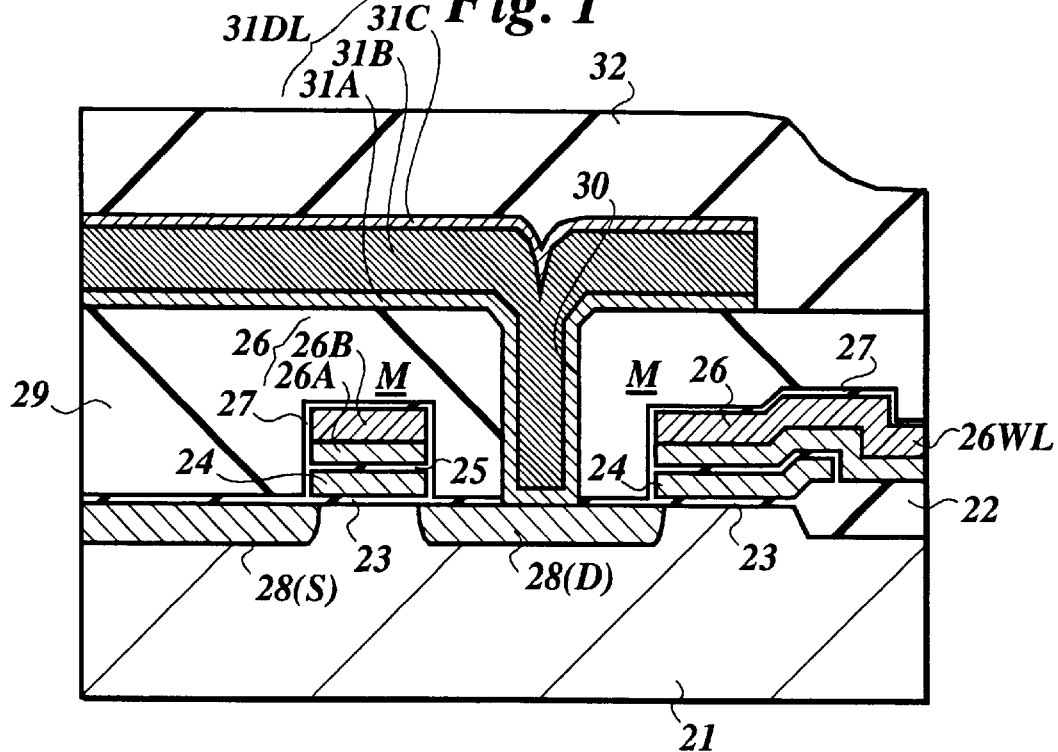
FIG. 1 is a sectional view (sectional view being cut off along a cut line F1—F1 in FIG. 2) showing a configuration of a nonvolatile memory element in a nonvolatile memory device according to a first embodiment of the present invention.
Figure 2:
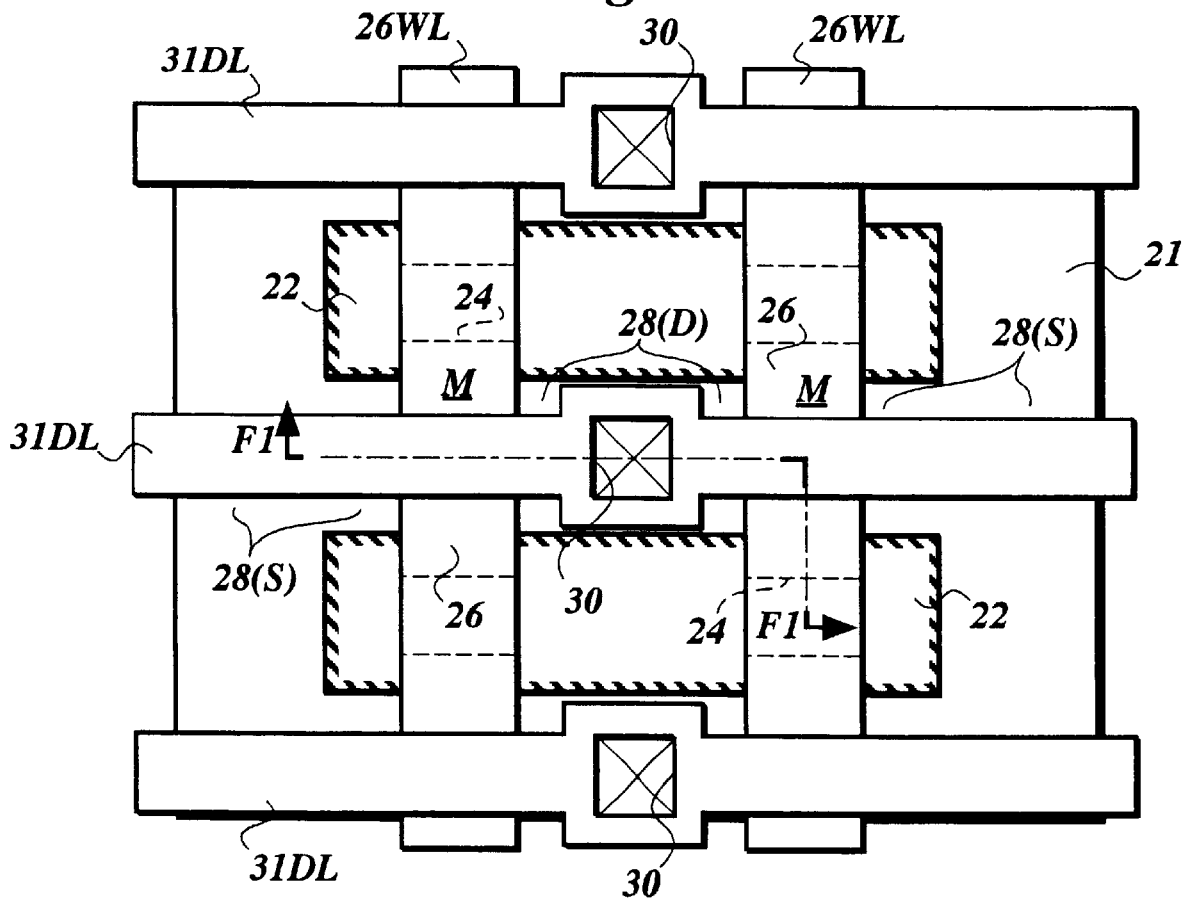
FIG. 2 is a plan view showing the configuration of the nonvolatile memory device according to the first embodiment of the present invention.

A nonvolatile memory device shown in FIGS. 1 and 2 is composed mainly of a semiconductor substrate 21 formed of a p-type single crystal silicon substrate. As the semiconductor substrate 21, either a semiconductor substrate in which an p-type well region having a slightly high impurity concentration is formed on a principal plane of a p-type single crystal silicon substrate or a semiconductor substrate in which a p-type well region is formed on a principal plane of an n-type single crystal silicon substrate may be employed. A nonvolatile memory element M is formed in a region surrounded by a device separating insulating film (field isolation film) 22 on a principal plane of the semiconductor substrate 21.

The nonvolatile memory element M comprises a channel forming region, a first gate insulating film 23, a floating gate electrode 24, a second gate insulating film 25, a control gate electrode 26, and a pair of n-type semiconductor regions 28 employed as a source region and a drain region. The channel forming region is formed by introducing the threshold voltage adjusting impurity onto a surface region of the semiconductor substrate 21.

The floating gate electrode 24 is formed as an information storage portion for holding charges serving as information. The floating gate electrode 24 is formed of a polysilicon film, for example. Impurity, preferably, phosphorus (P), is doped into this polysilicon film to ensure conductive property. In order to prevent leakage of charges acting as information and improve an information retaining characteristic, at least the floating gate electrode 24 is covered with a fine silicon oxide film 27.

A potential necessary for information write operation, and information read operation, and also information erase operation in a nonvolatile memory element M of an electrically erasable and programmable read-only memory (EEPROM) ,is applied to the control gate electrode 26. The control gate electrode 26 is formed in the gate width direction integrally with a word line 26WL, which is electrically connected to the nonvolatile memory element M. The control gate electrode 26 is formed of a composite film (so-called polycide film) which consists of a polysilicon film 26A and a silicide film 26B being deposited on a surface of the polysilicon film 26A. The impurity, preferably, P, is doped into the polysilicon film 26A to ensure the conductive property. A compound film such as $WSi_2$ film, $TiSi_2$ film, $MoSi_2$ film, etc., for example, which consists of a refractory metal and silicon is employed as the silicide film 26B.

The n-type semiconductor regions 28 is formed as a double diffused structure by doping n-type impurities of As (arsenic) and P each of which has a different diffusion velocity. The n-type semiconductor regions 28 may be formed as an LDD (Lightly Doped Drain) structure in which the channel forming region side is formed at a low impurity concentration.

A data line (bit line) 31DL is electrically connected to the n-type semiconductor regions 28 which is employed as the drain region. The data line 31DL is formed on an interlayer insulating film 29 which covers the nonvolatile memory element M, and is connected to the n-type semiconductor regions 28 via a connection hole 30 being formed in the interlayer insulating film 29. The data line 31DL is formed of a composite film which is formed by stacking a barrier metal film 31A, an aluminum alloy film 31B, a TiNx film 31C in sequence respectively.

The barrier metal film 31A is formed for the purpose of preventing an alloy spike phenomenon. Preferably, a composite film consisting of a Ti film and a TiNx film is employed as the barrier metal film 31A.

The aluminum alloy film 31B has a smallest resistance value in the conductors being employed in the nonvolatile memory element M, and is thus employed as a main wiring film. In the aluminum alloy film 31B, additives such as Si which can suppress the alloy spike, Cu which can suppress electromigration, etc. are added to aluminum. In place of the aluminum alloy film 31B, a pure aluminum film may be employed.

The TiNx film 31C is formed by the photolithography technology and is employed as a reflection preventing film. The TiNx film 31C can prevent excessive exposure due to a halation phenomenon generated by an etching mask which is employed in patterning the data line 31DL. If a nitrogen composition ratio x of the TiNx film 31C is set higher, reflectance of a surface of the TiNx film 31C becomes lower so that the TiNx film 31C can achieve higher performance as a reflection preventing function. However, if the nitrogen composition ratio x of the TiNx film 31C is set too high, inert gases such as $N_2$ gas, Ar gas, etc. are generated from the TiNx film 31C in the sintering step (heat treatment step) in the course of manufacturing process. As a result, peeling of a protection film 32 and disconnection of the data line 31DL are caused.

Figure 3A:
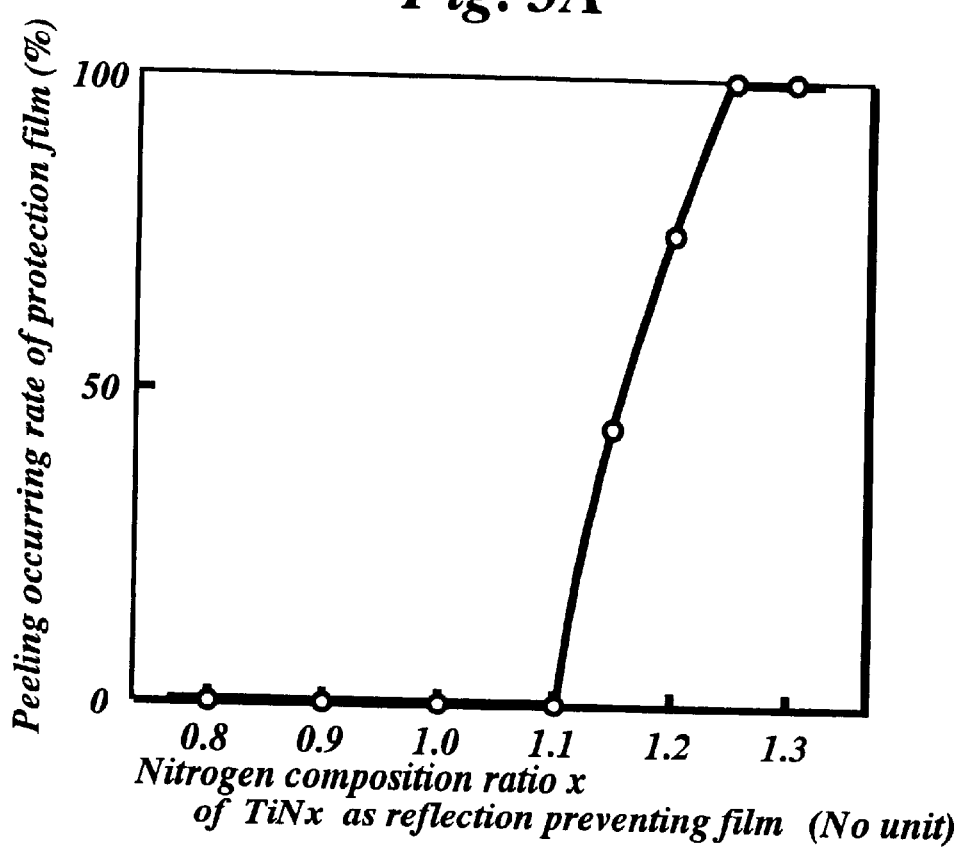
FIG. 3A is a view showing a relationship between a nitrogen composition ratio x of a TiNx film and a peeling occurring rate of a protection film in the first embodiment of the present invention.

As shown in FIG. 3A, a peeling occurring rate of the protection film is reduced substantially into zero when the nitrogen composition ratio x is reduced rather than 1.10. Hence, the nitrogen composition ratio x of the TiNx film 31C is adjusted less than 1.1 prior to the sintering step. Conversely, the higher nitrogen composition ratio x of the TiNx film 31C is preferable to reduce the reflectance. Thus, in order to keep the sufficient reflection preventing function of the TiNx film 31C, it is preferable that the nitrogen composition ratio x should be adjusted to more than 0.8. In other words, in the first embodiment, the nitrogen composition ratio x of the TiNx film 31C is set to more than 0.8 and less than 1.1.

Figure 3B:
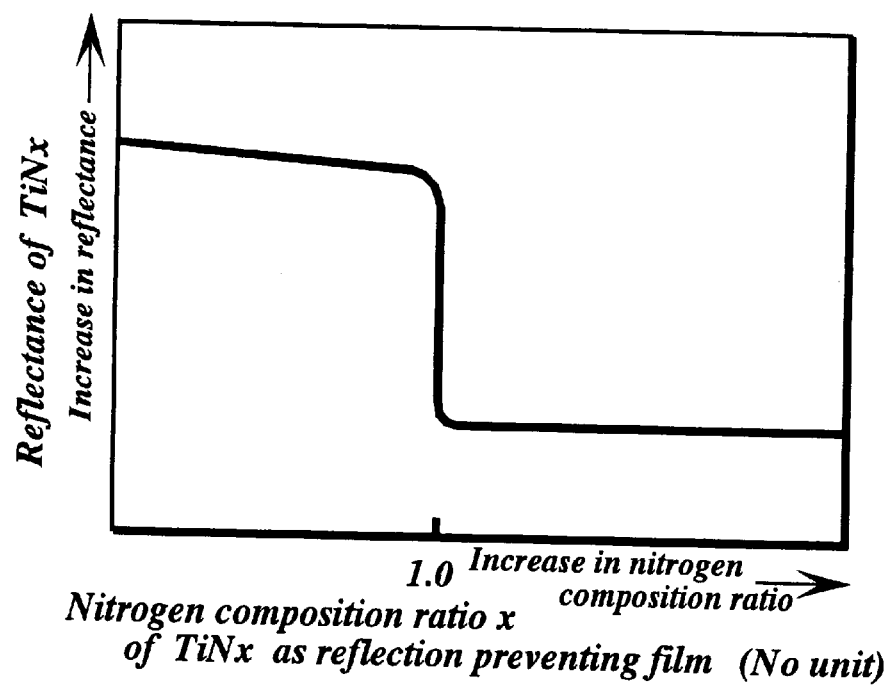
FIG. 3B is a view showing a relationship between the nitrogen composition ratio x of the TiNx film and reflectance of the TiNx film in the first embodiment of the present invention.

As the result of further study of the inventors of the present invention, as shown in FIG. 3B, it has been found that, if the nitrogen composition ratio x of the TiNx film 31C is set to more than 0.8 and below 1.0, it is difficult to form the film by employing the stable composition ratio and thus the TiNx film 31C has high reflectance close to the Ti film and that, if the nitrogen composition ratio x of the TiNx film 31C is set to 1.0, it is possible to form the film by employing the stable composition ratio and thus the reflectance of the TiNx film 31C can be reduced abruptly. In addition, it has been found that, if the nitrogen composition ratio x of the TiNx film 31C is set higher than 1.0, constant low reflectance can be derived. In more detail, if the nitrogen composition ratio x of the TiNx film 31C is set to more than 1.01, such constant low reflectance can be derived. That is to say, the most suitable nitrogen composition ratio x of the TiNx film 31C is more than 1.01 and less than 1.10.

The n-type semiconductor regions 28 employed as the source region is formed integrally with the n-type semiconductor regions 28 of the adjacent nonvolatile memory element M, and is used as a ground line.

The protection film 32 which covers the data line 31DL and the nonvolatile memory element M is formed on the data line 31DL. A plasma CVD silicon oxide film which is formed by the plasma CVD method to enable fine film quality and low temperature film formation is employed as the protection film 32. The protection film 32 can enhance a retaining characteristic of information stored in the nonvolatile memory element M.

Next, a method of manufacturing the above nonvolatile memory device will be explained with reference to FIGS. 4 to 12.

Figure 4:
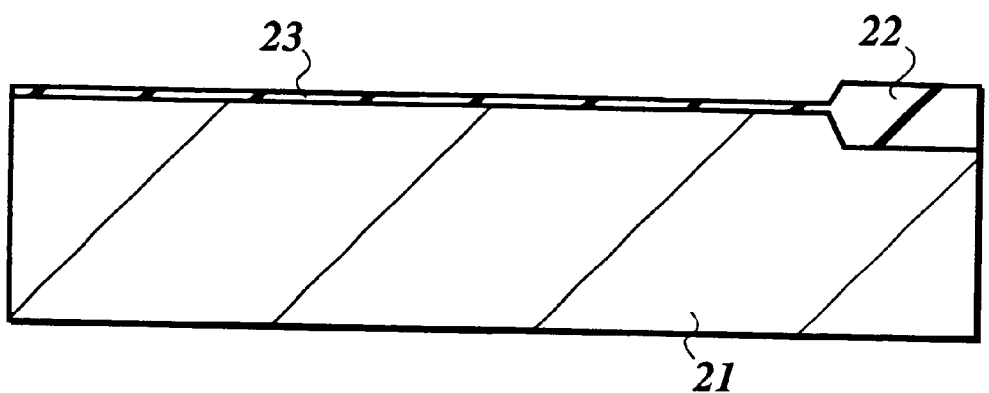
FIGS. 4 to 12 are sectional views showing manufacturing steps to explain a method of manufacturing the nonvolatile memory device according to the first embodiment of the present invention respectively.

(1) First, the element separating insulating film 22 is formed between the nonvolatile memory elements M on the semiconductor substrate 1 (see FIG. 4). A silicon oxide film which is formed by oxidizing the principal plane of the semiconductor substrate 1 by virtue of the selective oxidation method is employed as the element separating insulating film 22. This silicon oxide film is formed to have a thickness of 400 nm to 600 nm, for example.

(2) In a nonvolatile memory element M forming region, as shown in FIG. 4, the first gate insulating film 23 is then formed on the principal plane of the semiconductor substrate 1. The silicon oxide film which is formed by thermal-oxidizing the principal plane of the semiconductor substrate 1 by virtue of the thermal oxidation method is employed as the first gate insulating film 23. This silicon oxide film is formed to have a thickness of 8 nm to 15 nm, for example.

Figure 5:
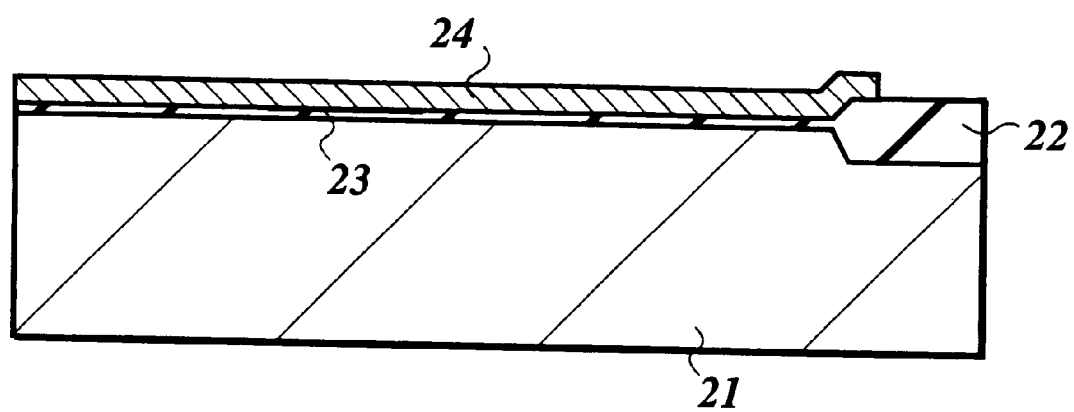

(3) As shown in FIG. 5, the floating gate electrode 24 is then formed on a surface of the first gate insulating film 23. A polysilicon film which is deposited by the CVD method is employed as the floating gate electrode 24. This polysilicon film is formed to have a thickness of 100 nm to 250 nm, for example. P is doped into the polysilicon film to ensure conductive property in the $POCl_3$ atmosphere. The floating gate electrode 24, after deposited, is patterned for the first time to define a gate width previously.

Figure 6:
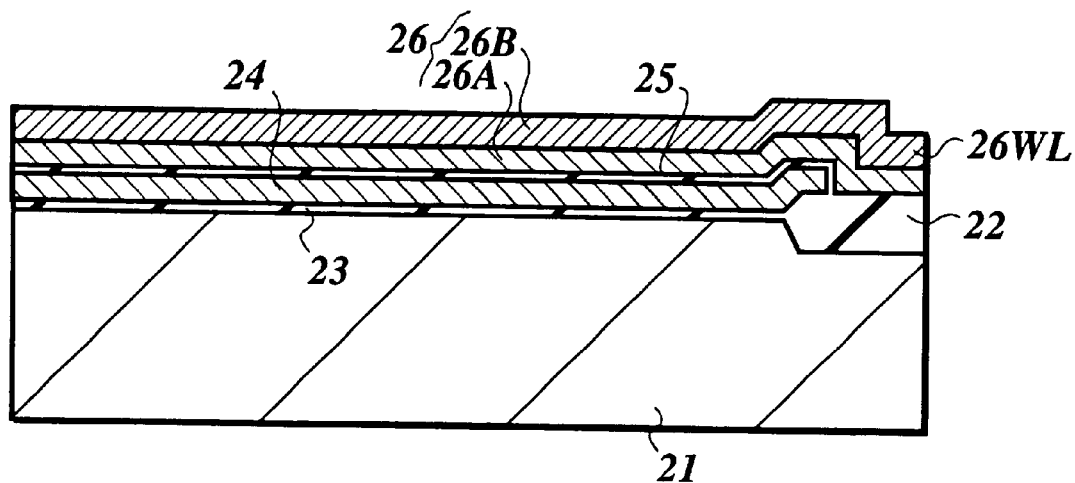

(4) The second gate insulating film 25 is then formed on a surface of the floating gate electrode 24 (see FIG. 6). A silicon oxide film which is formed by oxidizing a surface of the floating gate electrode 24 by the thermal oxidation method is employed as the second gate insulating film 25. This silicon oxide film is formed to have a thickness of 15 nm to 35 nm, for example.

(5) As shown in FIG. 6, the control gate electrode 26 is then formed on a surface of the second gate insulating film 25. A composite film which a polysilicon film 26A deposited by the CVD method and a silicide film 26B deposited by the sputtering is employed as the control gate electrode 26. The polysilicon film 26A is formed to have a thickness of 100 nm to 250 nm, for example. The silicide film 26B is formed to have a thickness of 50 nm to 300 nm, for example. P is doped into the polysilicon film 26A to ensure the conductive property in the $POCl_3$ atmosphere.

Figure 7:
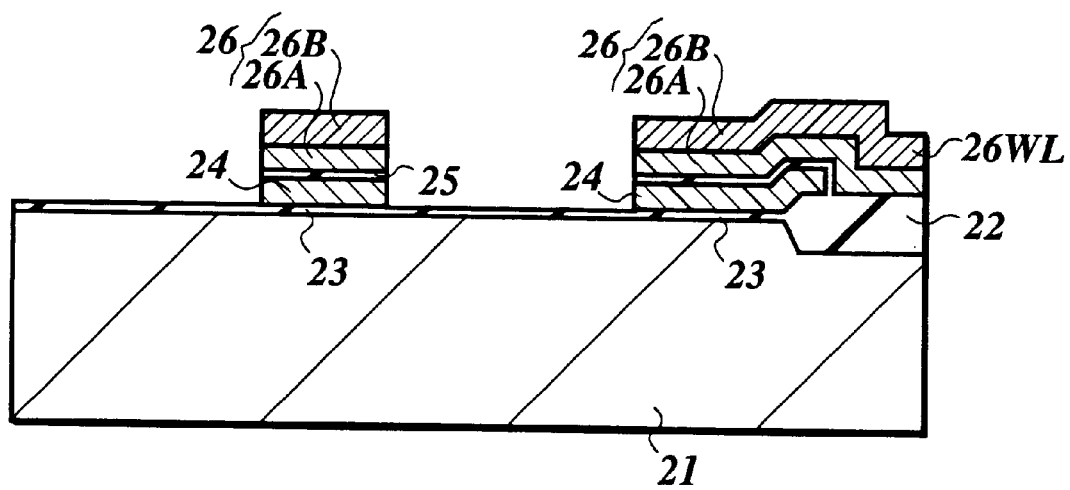

As shown in FIG. 7, the control gate electrode 26 is then patterned for the second time to decide a gate length after deposition. According to this second patterning, not only the gate length of the control gate electrode 26 but also a gate length of the floating gate electrode 24 is decided. In other words, the control gate electrode 26 and the floating gate electrode 24 which are stacked are cut out by the second patterning respectively, so that a gate length of the insulated-gate field effect transistor can be decided. The word line 26WL is formed simultaneously with formation of the control gate electrode 26. The second patterning is effected by anisotropic etching by using the RIE method.

Figure 8:
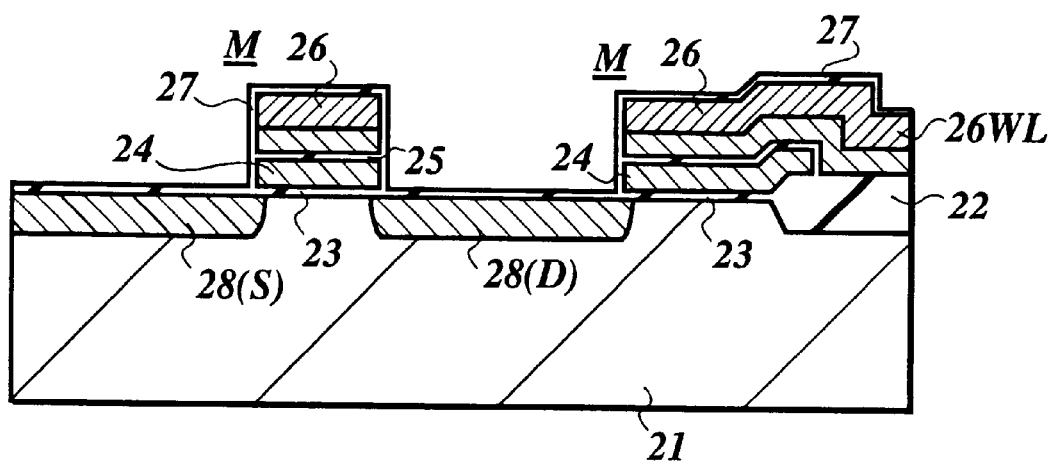

(6) A pair of n-type semiconductor regions 28 employed as the source region and the drain region are then formed on the principal plane of the semiconductor substrate 1 in a self-aligned manner with respect to the control gate electrode 26 and the floating gate electrode 24 (see FIG. 8). The n-type semiconductor regions 28 are formed by introducing the n-type impurity into the principal plane of the semiconductor substrate 1 by using the ion implantation method, while using the control gate electrode 26 and the floating gate electrode 24 and the element separating insulating film 22 as a mask. As and P which have a different diffusion coefficient are employed as the n-type impurity. Then-type semiconductor regions 28 are formed to have a double diffusion structure respectively. The nonvolatile memory element M is completed when the n-type semiconductor regions 28 are formed.

(7) As shown in FIG. 8, the silicon oxide film 27 is then formed to cover respective surfaces of the control gate electrode 26 and the floating gate electrode 24. In order to improve information retaining characteristic, the silicon oxide film 27 is formed by the thermal oxidation method to enable the fine film quality.

Figure 9:
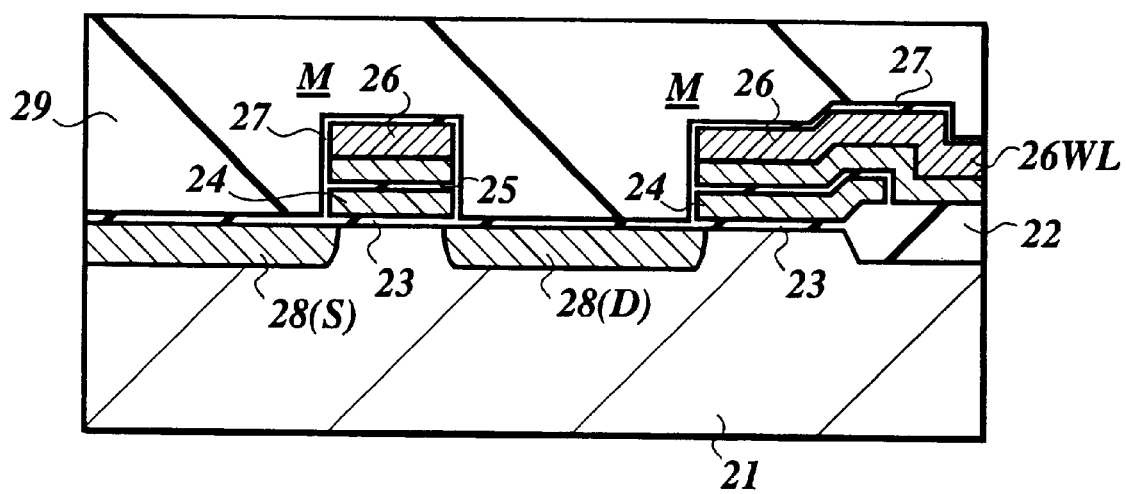

(8) As shown in FIG. 9, the interlayer insulating film 29 covering the nonvolatile memory element M is then formed on an overall surface of a resultant structure. The BPSG (Borophosphosilicate glass) film is employed as the interlayer insulating film 29. A surface of the BPSG film, after deposited, is planarized by applying glass flow.

Figure 10:
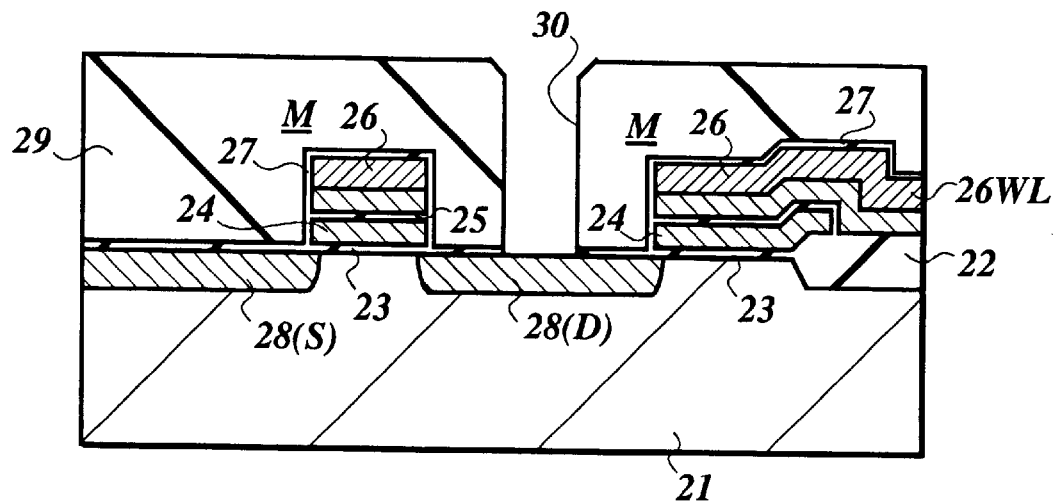

(9) As shown in FIG. 10, the connection hole 30 is then formed in the interlayer insulating film 29 on the n-type semiconductor region 28 employed as the drain region of the nonvolatile memory element M. The connection hole 30 is formed by anisotropic etching by using the RIE method.

Figure 11:
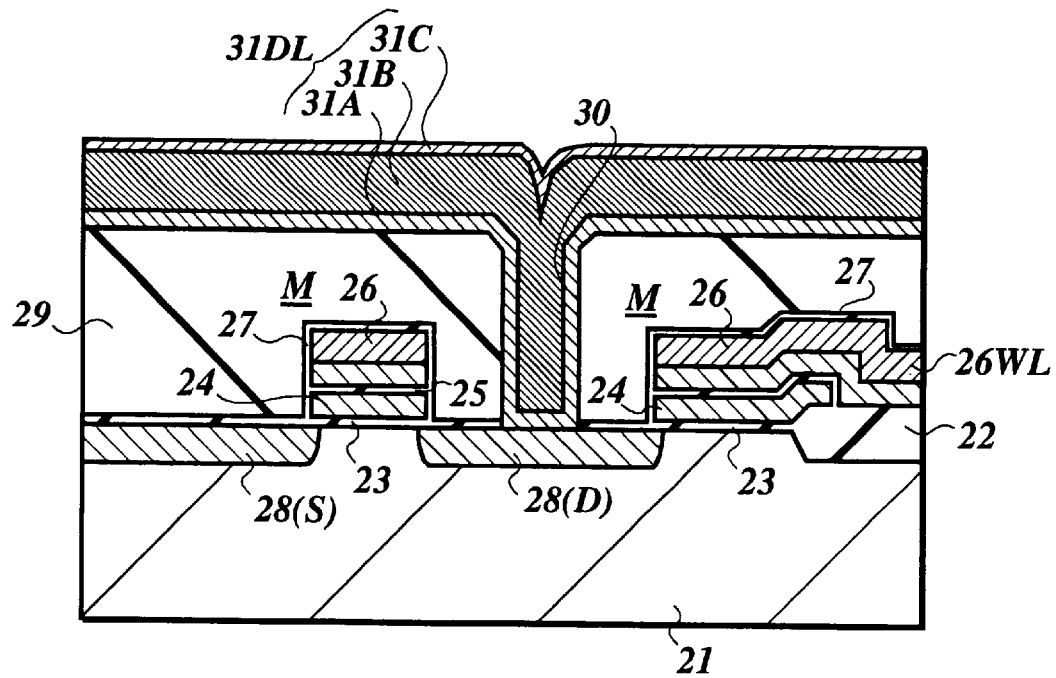

(10) As shown in FIG. 11, the barrier metal film 31A, the aluminum alloy film 31B, and the TiNx film 31C are then deposited in sequence on the interlayer insulating film 29 respectively to form wiring layers. A composite film consisting of the Ti film and the TiNx film, for example, is employed as the barrier metal film 31A. A thickness of the Ti film is set to 10 nm to 50 nm, and a thickness of the TiNx film is set to 50 nm to 100 nm. Both the Ti film and the TiNx film are formed by the sputtering method. The aluminum alloy film 31B is formed by the sputtering method to have a thickness of 700 nm to 800 nm, for example. The TiNx film 31C is formed by the sputtering method to have a thickness of 20 nm to 30 nm, preferably 30 nm, for example.

In order to prevent the peeling of protection film 32 formed later while keeping the reflection preventing function, the nitrogen composition ratio x of the TiNx film 31C is adjusted at the same time when it is sputtered. The TiNx film 31C is formed by the sputtering using a Ti target in the Ar and $N_2$ gas atmosphere. A rate of the $N_2$ gas is set to less than about 50% in this sputtering such that the nitrogen composition ratio x of the TiNx film 31C, after formed as the film, can be adjusted to less than 1.1. Preferably, as described above, the nitrogen composition ratio x should be adjusted more than 0.8 and less than 1.1. More preferably, the nitrogen composition ratio x should be adjusted in the range of 1.01 to 1.1. Since such adjustment of the nitrogen composition ratio x is performed prior to patterning of the aluminum alloy film 31B, generation of the aluminum hillock which is grown from the patterned sidewall of the aluminum alloy film 31B in the lateral direction can be prevented.

Figure 12:
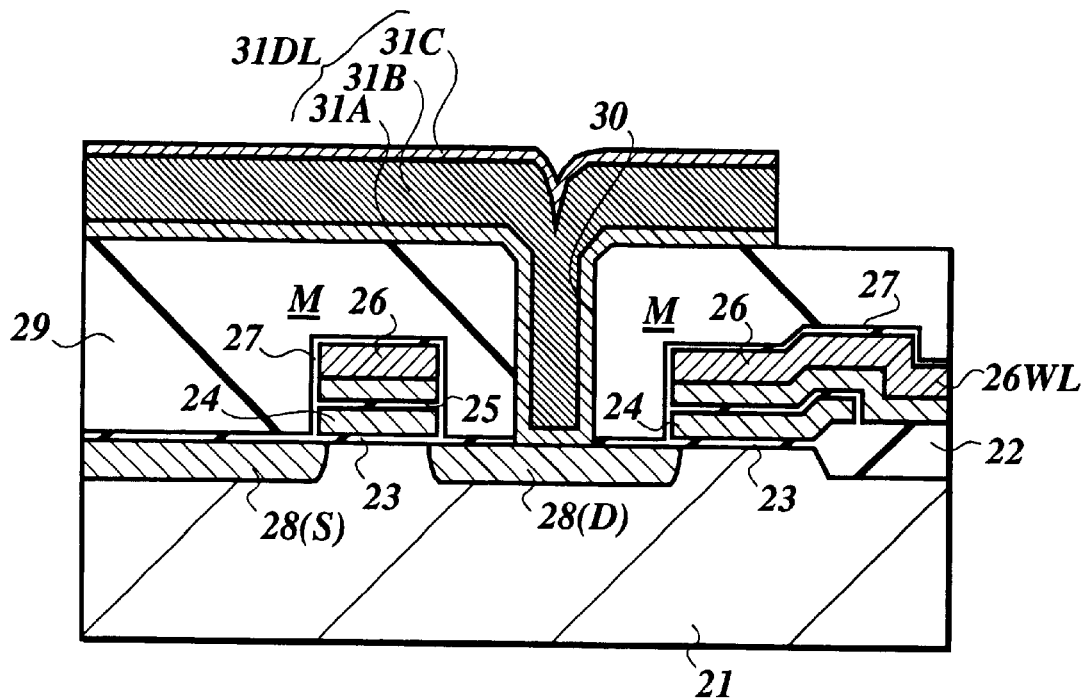

(11) As shown in FIG. 12, the TiNx film 31C, the aluminum alloy film 31B, and the barrier, metal film 31A are then patterned in sequence respectively to form the data line 31DL. Such patterning is carried out by anisotropic etching. At that time, the RIE method is employed by using an etching mask (photoresist mask) being formed by the photolithography technology. Since the TiNx film 31C is formed as the reflection preventing film on the uppermost layer of the data line 31DL in patterning, excessive exposure due to the halation phenomenon which is caused by reflection of light on a surface of the aluminum alloy film 31B can be prevented, so that fine patterning of the data line 31DL can be achieved.

(12) As shown above in FIG. 1, the protection film 32 covering the data line 31DL is then formed. The plasma CVD silicon oxide film which is formed by reacting a $SiH_4$ gas, an $N_2O$ gas, and the $N_2$ gas in the Ar plasma atmosphere at the substrate temperature 400° C. is employed as the protection film 32.

(13) In order to recover damage of the aluminum alloy film 31B of the data line 31DL, sintering is then effected. Such sintering is effected at the heat treatment temperature of 450° C. in the forming gas atmosphere for about five minutes. The mixed gas consisting of the $H_2$ gas and the $N_2$ gas is used as the forming gas. A flow rate ratio of the mixed gas is adjusted to $H_2:N_2=1:9$. In this sintering step, since the nitrogen composition ratio x of the TiNx film 31C of the data line 31DL is adjusted properly, generation of the $N_2$ gas and the Ar gas from the TiNx film 31C does not become an issue substantially. That is, peeling of the protection film 32 and disconnection of the data line 31DL can be prevented.

When a series of above manufacturing steps have been completed, the nonvolatile memory device according to the first embodiment of the present invention can be implemented.

SECOND EMBODIMENT

In a second embodiment, an example will be explained wherein the nitrogen composition ratio is adjusted after deposition of the TiNx film before formation of the protection film in the method of manufacturing a nonvolatile memory device.

The method of manufacturing the nonvolatile memory device according to the second embodiment of the present invention will be explained with reference to FIGS. 13 and 14.

Figure 13:
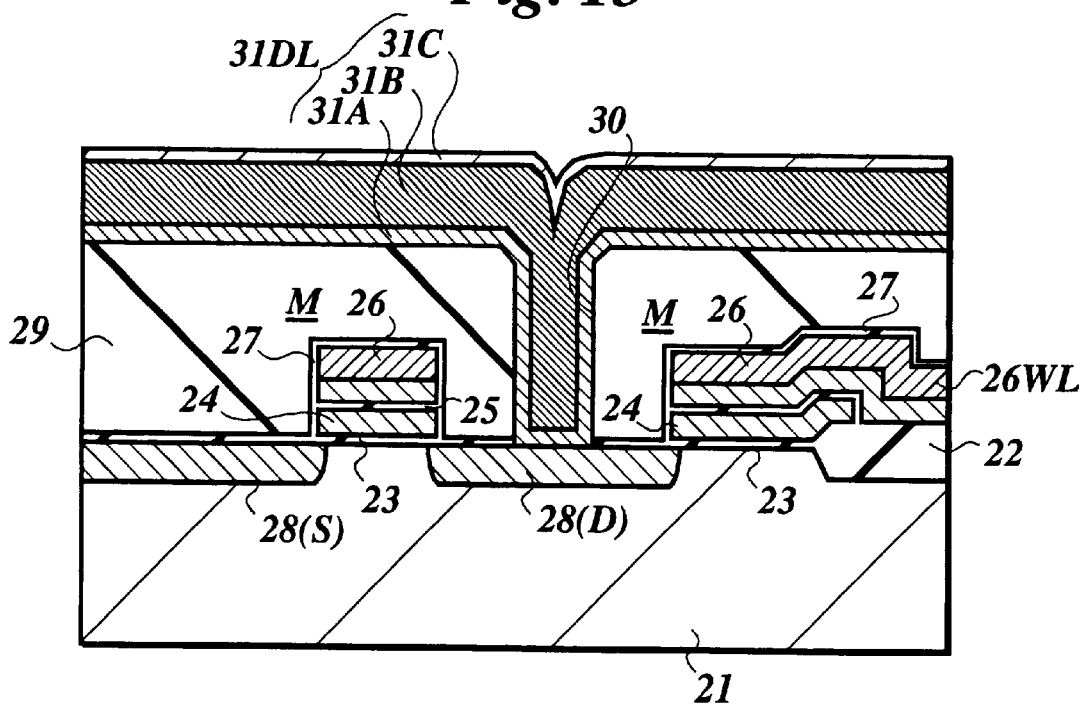
FIGS. 13 and 14 are sectional views showing manufacturing steps every step to explain a method of manufacturing a nonvolatile memory device according to a second embodiment of the present invention respectively.

(1) In the method of manufacturing the nonvolatile memory device according to the above first embodiment, after the connection hole 30 shown in FIG. 10 has been formed, the barrier metal film 31A, the aluminum alloy film 31B, and the TiNx film 31C which constitute the wiring layer are deposited in sequence on an overall surface of the resultant structure respectively to cover the interlayer insulating film 29, as shown in FIG. 13. At this point of time, the nitrogen composition ratio x of the TiNx film 31C has not been adjusted yet.

Figure 14:
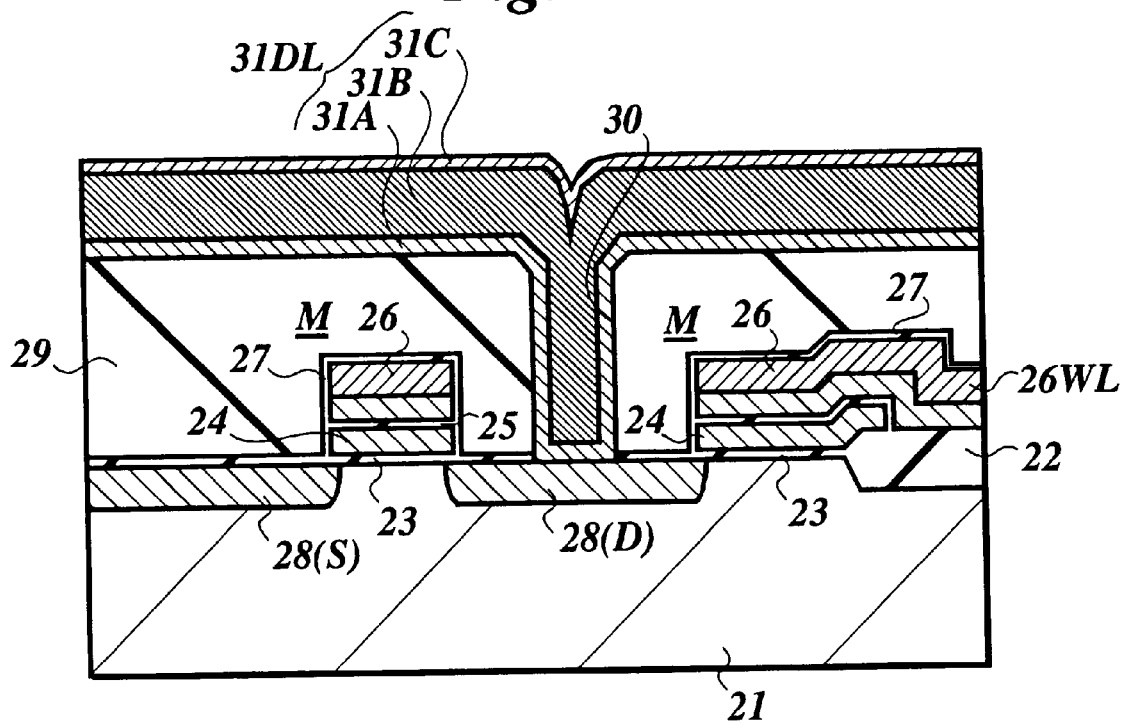

(2) As shown in FIG. 14, heat treatment is then applied to the TiNx film 31C to adjust the nitrogen composition ratio x of the TiNx film 31C. Such heat treatment is performed in the temperature range of 380° C. to 420° C., preferably 400° C., and therefore the nitrogen composition ratio x of the TiNx film 31C can be adjusted to less than 1.1.

(3) The data line 31DL is then formed by the patterning step shown in FIG. 12 mentioned above. The nonvolatile memory device according to the second embodiment can be accomplished by carrying out subsequent steps in the same way as those in the method of manufacturing the nonvolatile memory device according to the above first embodiment.

In the nonvolatile memory device according to the second embodiment, like the nonvolatile memory device according to the above first embodiment, peeling of the protection film 32 and disconnection of the data line 31DL can be prevented while maintaining the reflection preventing function. In addition, the aluminum hillock which is generated in the lateral direction can be prevented.

THIRD EMBODIMENT

In a third embodiment, an example will be explained wherein the nitrogen composition ratio is adjusted after patterning of the TiNx film before patterning of the aluminum alloy film in the method of manufacturing the nonvolatile memory device. The method of manufacturing the nonvolatile memory device according to the third embodiment of the present invention will be explained with reference to FIG. 15.

Figure 15:
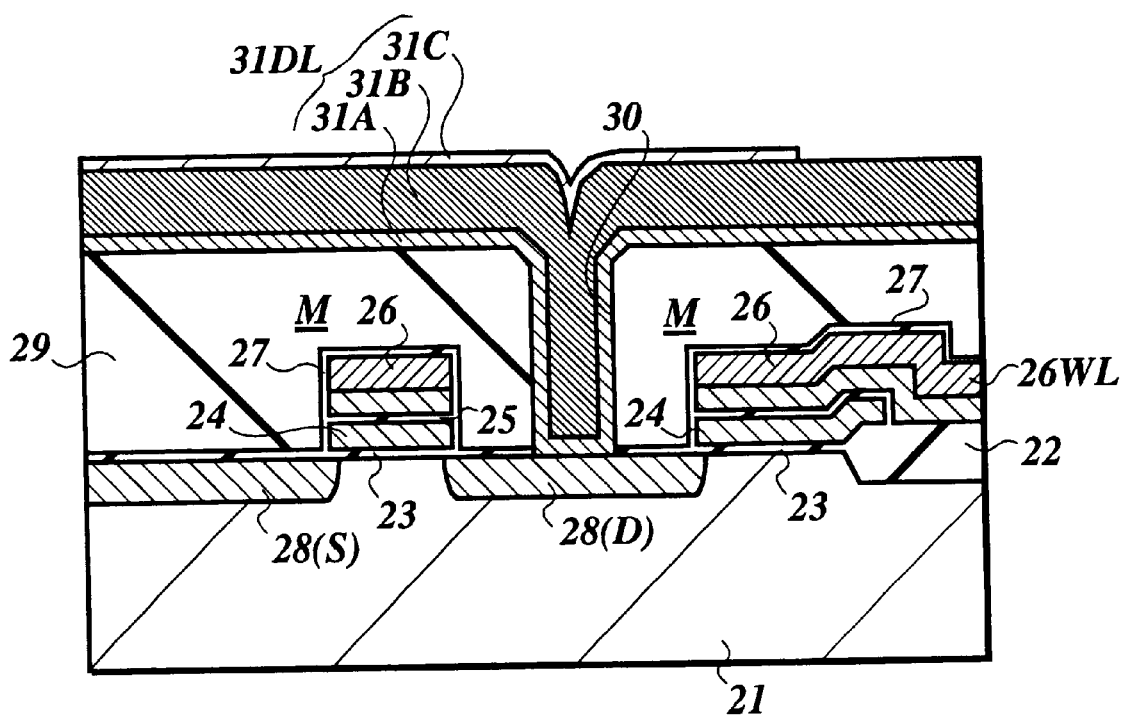
FIG. 15 is a sectional view showing predetermined manufacturing steps to explain a method of manufacturing a nonvolatile memory device according to a third embodiment of the present invention.
Figure 16:
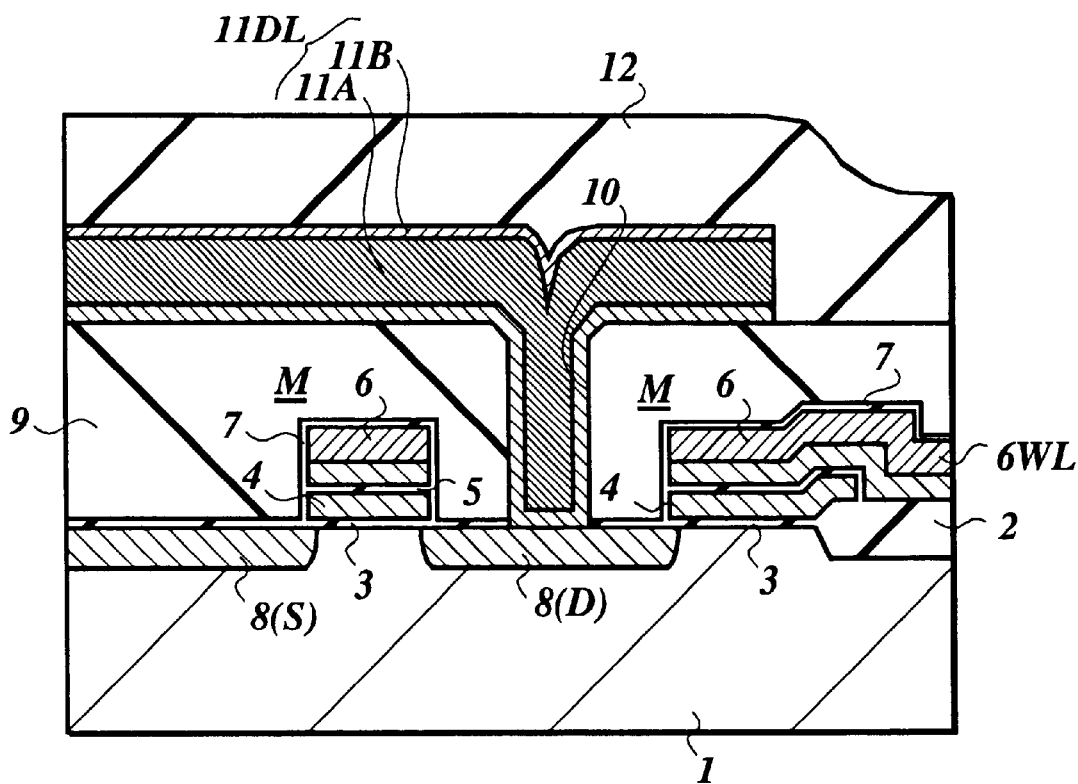
FIG. 16 is a sectional view showing a nonvolatile memory element in a nonvolatile memory device in the related art associated with the present invention.
Figure 17:
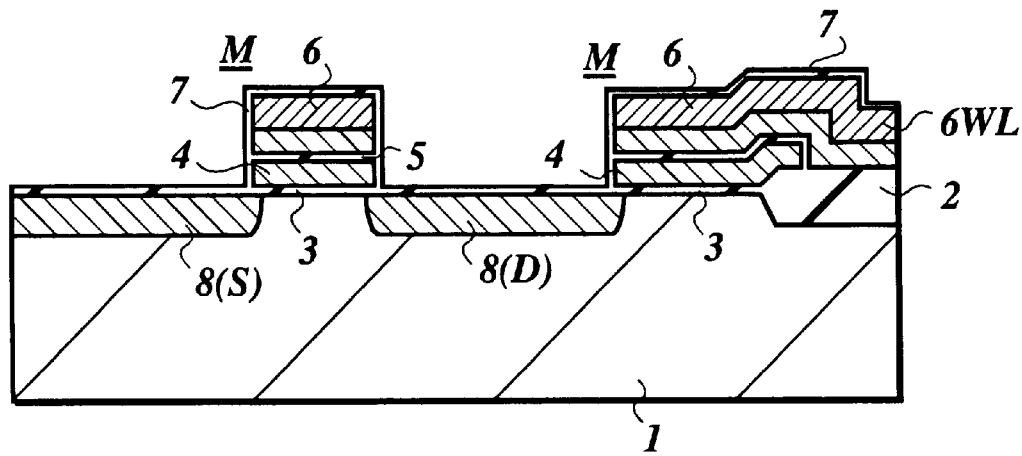
FIGS. 17 to 19 are sectional views showing manufacturing steps every step to explain a method of manufacturing the nonvolatile memory device in the related art associated with the present invention.
Figure 18:
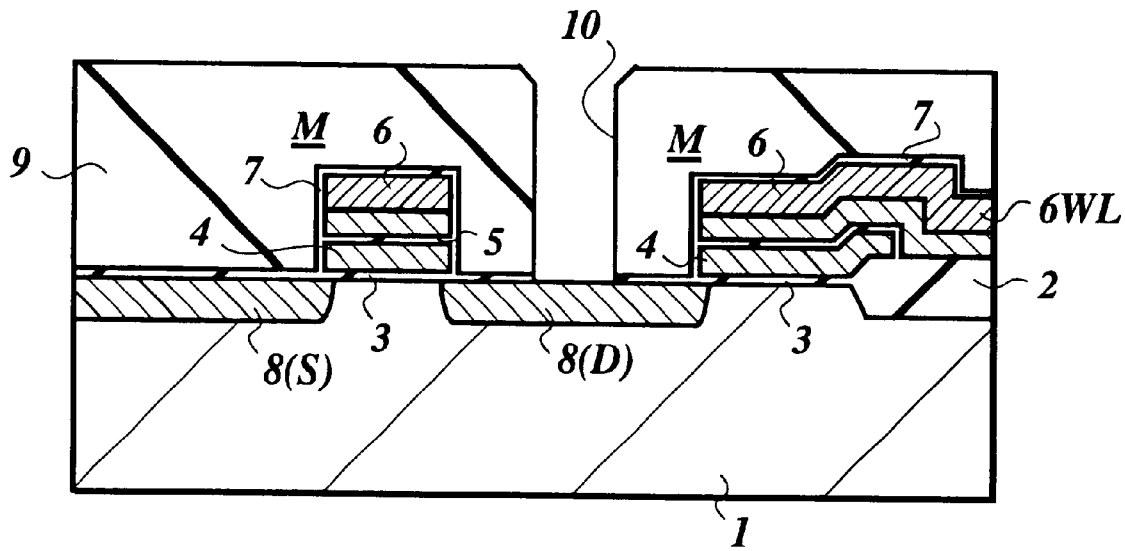
Figure 19:
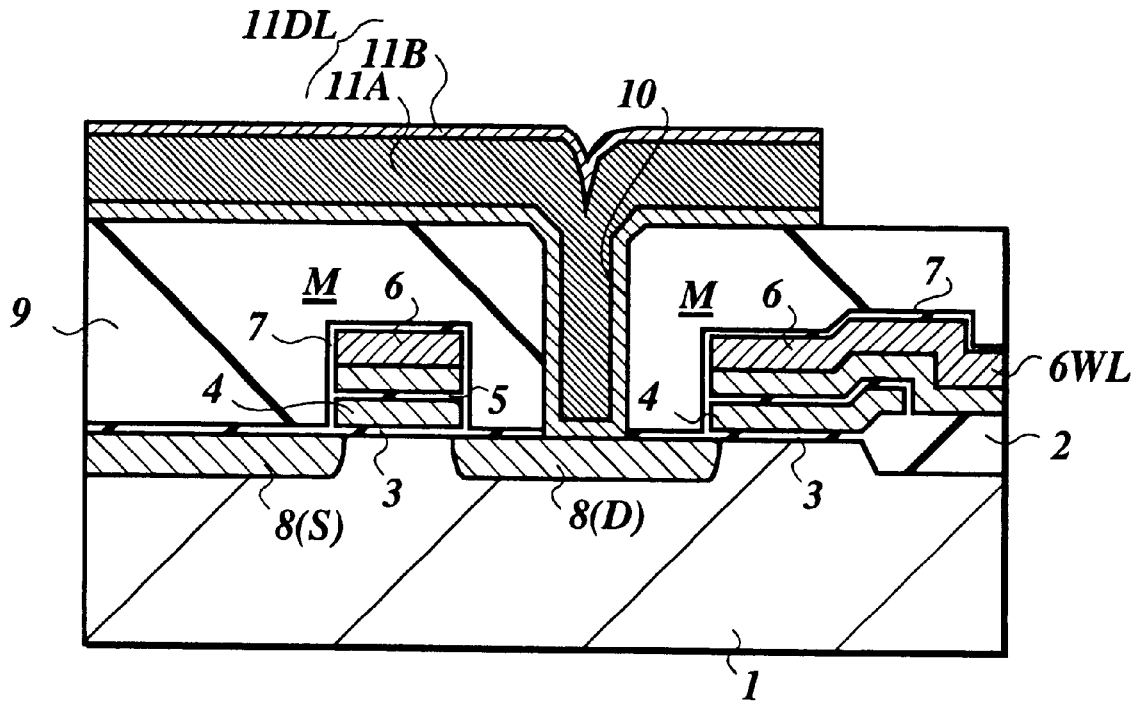
Figure 20:
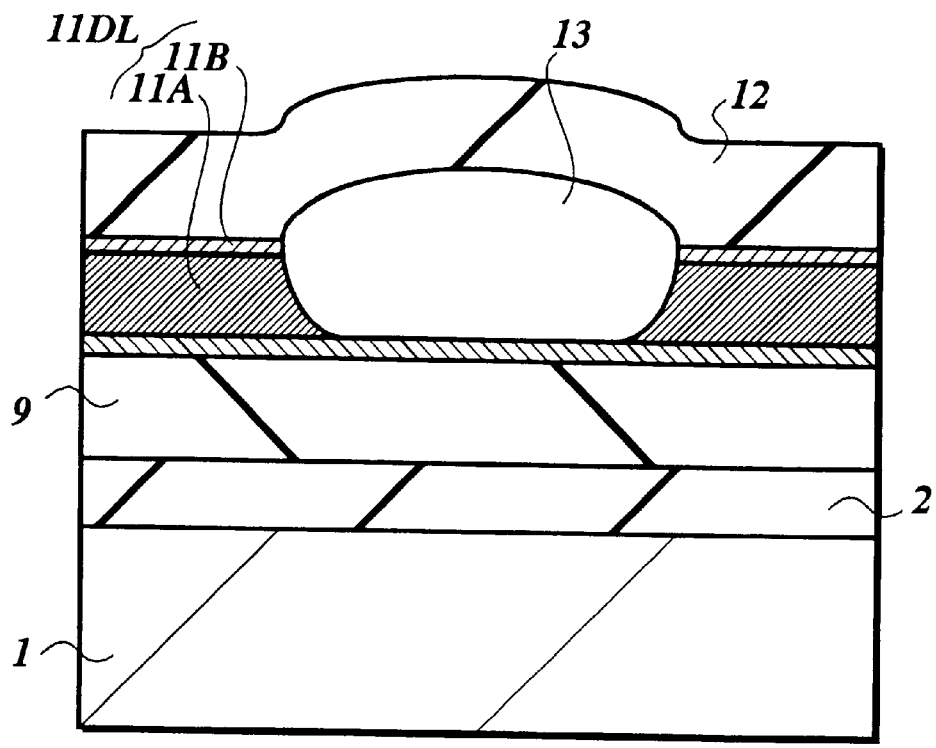
FIG. 20 is an enlarged sectional view showing a defective portion in the related art associated with the present invention.
Figure 21:
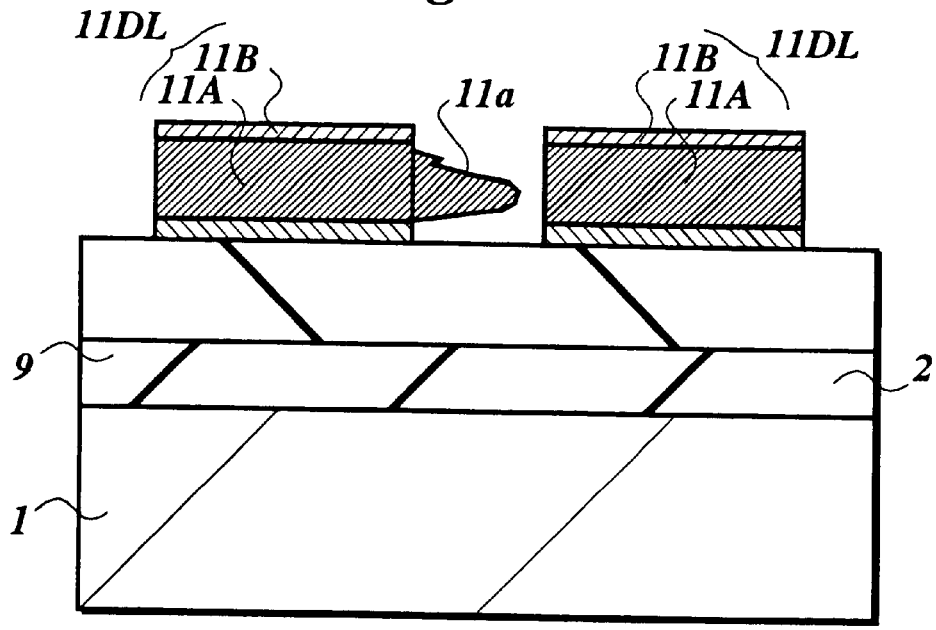
FIG. 21 is an enlarged sectional view showing another defective portion in the related art associated with the present invention.

(1) In the method of manufacturing the nonvolatile memory device according to the above second embodiment, the barrier metal film 31A, the aluminum alloy film 31B, and the TiNx film 31C which constitute the wiring layer are deposited in sequence on an entire surface of the structure shown in FIG. 13 respectively. Then, as shown in FIG. 15, only the TiNx film 31C is patterned to shape the data line 31DL. At this point of time, the nitrogen composition ratio x of the TiNx film 31C has not been adjusted yet.

(2) The heat treatment is then applied to the patterned TiNx film 31C to adjust the nitrogen composition ratio x of the TiNx film 31C. Such heat treatment is performed in the temperature range of 380° C. to 420° C., preferably 400° C. As a result, the nitrogen composition ratio x of the TiNx film 31C can be adjusted to less than 1.1.

(3) Subsequently, the aluminum alloy film 31B and the barrier metal film 31A are then patterned in sequence respectively to form the data line 31DL. The nonvolatile memory device according to the second embodiment can be accomplished by carrying out following steps in the same manner as those in the method of manufacturing the nonvolatile memory device according to the above first embodiment.

In the nonvolatile memory device according to the third embodiment, like the nonvolatile memory device according to the second embodiment, peeling of the protection film 32 and disconnection of the data line 31DL can be prevented while maintaining the reflection preventing function. In addition, the lateral aluminum hillock can be prevented.

With the above, the present invention has been made based on the foregoing embodiments, but the present invention is not limited to such embodiments. By way of example, the nonvolatile memory elements M according to the above embodiments is constructed as a one-transistor structure having the floating gate electrode 24, but the present invention may be applied to the nonvolatile memory device having the nonvolatile memory elements which is constructed as a two-transistor structure having the information storing transistor and the cell selection transistor. Furthermore, the present invention may be applied to any of the nonvolatile memory device which has the nonvolatile memory elements being constructed as the MNOS structure and the flash memory (nonvolatile memory device).

Moreover, the present invention is not limited to the nonvolatile memory device. The present invention may also be applied to the semiconductor memory device such as DRAM, SRAM, etc. which has the reflection preventing film at the uppermost layer of the wiring layer, and the semiconductor integrated circuit device such as Logic.

Still more, the present invention may also be applied to the wiring substrate such as a mother board, a daughter board, a baby board, a print circuit substrate, etc. In the present invention, the aluminum film or the aluminum alloy film is not always employed as the main wiring film of the wiring layer, and a Cu film or a Cu alloy film may be employed. In this case, since generation of hillock does not become an issue substantially, the step of adjusting the nitrogen composition ratio may be set in the course of deposition of the TiNx film to deposition of the protection film.

As described above, according to the present invention, the semiconductor device with high reliability, which is capable of preventing peeling of the protection film, disconnection of the wiring layers, etc. due to the inert gas which is generated from the reflection preventing film can be provided.

Further, the nonvolatile memory device with high reliability, which is capable of improving the information retaining characteristic while preventing peeling of the protection film, disconnection of wiring layers, etc. due to the inert gas which is generated from the reflection preventing film can be provided.

Furthermore, the method of manufacturing the semiconductor device, particularly the nonvolatile memory device, which is capable of improving yield of fabrication while preventing short-circuit between the wiring layers due to generation of the hillock can be provided.

What is claimed is:

1. A semiconductor device comprising:
  a wiring layer having a TiNx film which has a nitrogen composition ratio x of 1.01 to 1.1 and functions as a reflecting preventing film at the uppermost layer thereof; and
  a protection film formed on the wiring layer, wherein the nitrogen composition of the TiNx film is sufficient to effectively prevent peeling of the TiNx film and/or the protection film.

2. A semiconductor device according to claim 1, wherein the wiring layer consists of an aluminum alloy film and the TiNx film formed on the aluminum alloy film.

3. A semiconductor device according to claim 1, wherein the wiring layer consists of a barrier metal film, an aluminum alloy film formed on the barrier metal film, and the TiNx film formed on the aluminum alloy film.

4. A semiconductor device according to claim 1, wherein the protection film includes a plasma CVD film.

5. A semiconductor device according to claim 1, wherein the protection film contains a plasma CVD silicon oxide film.

6. A semiconductor device comprising:

a nonvolatile memory element;

a wiring layer formed on the nonvolatile memory element and having a TiNx film, which has a nitrogen composition ratio x of 1.01 to 1.1 and functions as a reflecting preventing film at the uppermost layer thereof; and a protection film formed on the wiring layer, wherein the nitrogen composition of the TiNx film is sufficient to effectively prevent peeling of the TiNx film and/or the protection film.

7. A semiconductor device according to claim 6, wherein the wiring layer consists of an aluminum alloy film and the TiNx film formed on the aluminum alloy film.

8. A semiconductor device according to claim 6, wherein the wiring layer consists of a barrier metal film, an aluminum alloy film formed on the barrier metal film, and the TiNx film formed on the aluminum alloy film.

9. A semiconductor device according to claim 6, wherein the protection film includes a plasma CVD film.

10. A semiconductor device according to claim 6, wherein the protection film contains a plasma CVD silicon oxide film.

* * * * *